United States Patent
Hu

(10) Patent No.: US 8,435,889 B2
(45) Date of Patent: *May 7, 2013

(54) METHODS OF FORMING $CoSi_2$, METHODS OF FORMING FIELD EFFECT TRANSISTORS, AND METHODS OF FORMING CONDUCTIVE CONTACTS

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/182,285

(22) Filed: Jul. 13, 2011

(65) Prior Publication Data

US 2011/0269288 A1 Nov. 3, 2011

Related U.S. Application Data

(63) Continuation of application No. 12/244,692, filed on Oct. 2, 2008, now Pat. No. 7,989,340, which is a continuation of application No. 11/195,174, filed on Aug. 2, 2005, now Pat. No. 7,449,410.

(51) Int. Cl.
*H01L 21/28* (2006.01)
*H01L 29/43* (2006.01)

(52) U.S. Cl.
USPC .... 438/655; 438/664; 438/682; 257/E29.156; 257/E29.161; 257/E21.199

(58) Field of Classification Search .................. 438/630, 438/655, 664, 682; 257/E29.156, E29.161, 257/E21.199
See application file for complete search history.

(56) References Cited

U.S. PATENT DOCUMENTS

| | | | |
|---|---|---|---|
| 5,356,837 | A | 10/1994 | Geiss et al. |
| 5,449,642 | A | 9/1995 | Tan et al. |
| 5,567,652 | A | 10/1996 | Nishio |
| 5,821,575 | A | 10/1998 | Mistry et al. |
| 5,824,600 | A | 10/1998 | Byun et al. |
| 5,851,921 | A | 12/1998 | Gardner et al. |
| 5,874,342 | A | 2/1999 | Tsai et al. |

(Continued)

FOREIGN PATENT DOCUMENTS

| | | |
|---|---|---|
| EP | 0 905 752 A2 | 3/1999 |
| WO | WO PCT/US2006/027367 | 11/2006 |
| WO | WO PCT/US2006/027367 | 3/2007 |

OTHER PUBLICATIONS

C. Detavernier et al., CoSi2 formation in the presence of Ti, Ta or W, Thin Solid Films, vol. 468, pp. 174-182 (2004).

(Continued)

*Primary Examiner* — George Fourson, III
(74) *Attorney, Agent, or Firm* — Wells St. John, P.S.

(57) ABSTRACT

The invention included to methods of forming $CoSi_2$, methods of forming field effect transistors, and methods of forming conductive contacts. In one implementation, a method of forming $CoSi_2$ includes forming a substantially amorphous layer comprising $MSi_x$ over a silicon-containing substrate, where "M" comprises at least some metal other than cobalt. A layer comprising cobalt is deposited over the substantially amorphous $MSi_x$-comprising layer. The substrate is annealed effective to diffuse cobalt of the cobalt-comprising layer through the substantially amorphous $MSi_x$-comprising layer and combine with silicon of the silicon-containing substrate to form $CoSi_2$ beneath the substantially amorphous $MSi_x$-comprising layer. Other aspects and implementations are contemplated.

32 Claims, 11 Drawing Sheets

U.S. PATENT DOCUMENTS

| | | | |
|---|---|---|---|
| 6,150,249 | A | 11/2000 | Lee et al. |
| 6,437,445 | B1 | 8/2002 | Lee et al. |
| 6,461,957 | B1 | 10/2002 | Yokoyama et al. |
| 6,514,885 | B1 | 2/2003 | Onga et al. |
| 6,620,718 | B1 * | 9/2003 | Wieczorek et al. ........... 438/592 |
| 6,743,687 | B1 | 6/2004 | Yu |
| 6,846,359 | B2 | 1/2005 | Lim et al. |
| 7,105,443 | B2 | 9/2006 | Ahn et al. |
| 2002/0098692 | A1 | 7/2002 | Miura |
| 2002/0142616 | A1 | 10/2002 | Giewont et al. |
| 2002/0151170 | A1 | 10/2002 | Maex et al. |
| 2002/0153612 | A1 | 10/2002 | Akram et al. |

OTHER PUBLICATIONS

F. Hong et al., Mechanisms of epitaxial CoSi2 formation in the multilayer Co/Ti-Si(100) system, Applied Physics Letters, vol. 64, pp. 2241-2243 (Apr. 25, 1994).

J. Jeong et al., Ep[itaxial cobalt silicide formation using a Co/TiSix bilayer on Si (100) by sputtering, Surface and Coatings Technology, vol. 171, pp. 6-10 (2003).

Li, Bing-Zon, et al., Epitaxial Growth of CoSi3 by Co/Ti/Si Solid Phase Reaction and its Application in Salicide Technology, IEEE, date unknown, pp. 29-34.

Liu, R., R., et al., "Mechanisms for Process—Induced Leakage in Shallow Silicided Junctions", IEDM 1986, pp. 58-61.

O. Akhavan et al., Single-crystalline growth of CoSi2 by refractory-interlayer-mediated epitaxy, Applied Surface Science, vol. 233, pp. 123-128 (2004).

XP Qu et al., Epitaxial growth of CoSi2 film by Co/a-Si/Ti/Si(100) multilayer solid state reaction, Journal of Applied Physics, vol. 89, No. 5, pp. 2641-2648 (Mar. 1, 2001).

Y. Suh et al., Investigation of stress behaviors and mechanism of void formation in sputtered TiSix films, Thin Solid Films, vol. 450, pp. 341-345 (2004).

* cited by examiner

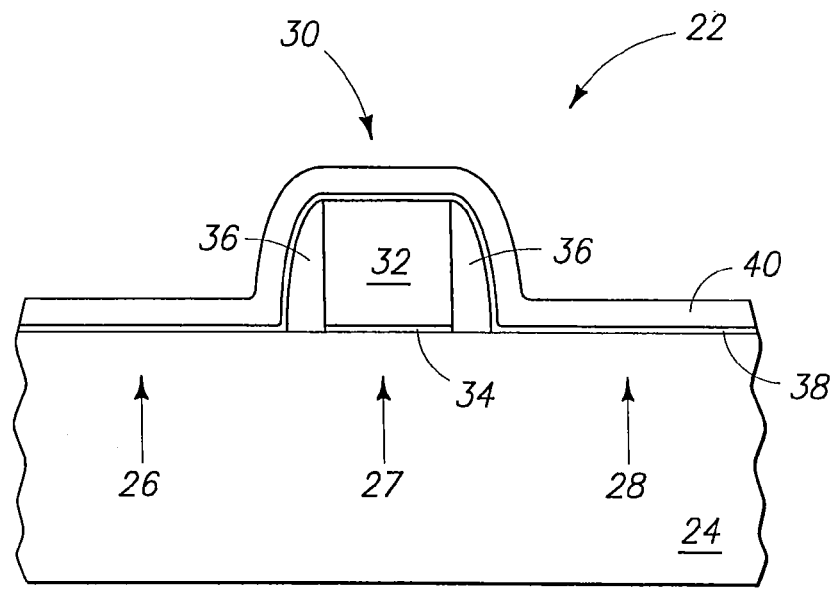
_FIG. 2_
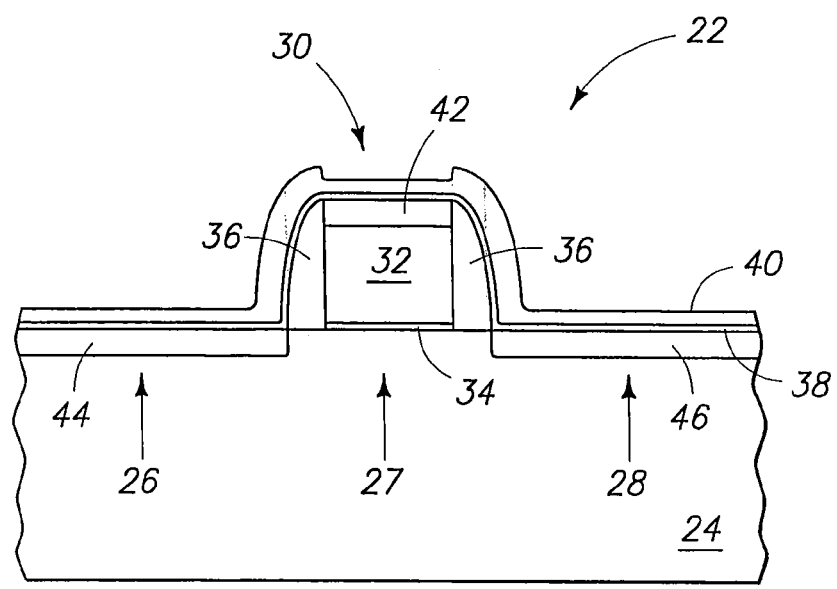
_FIG. 3_

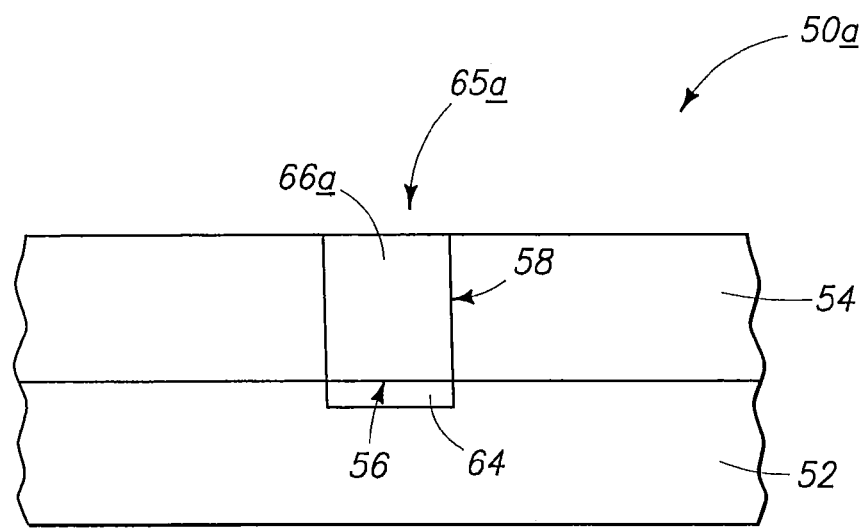
F I G _II_II
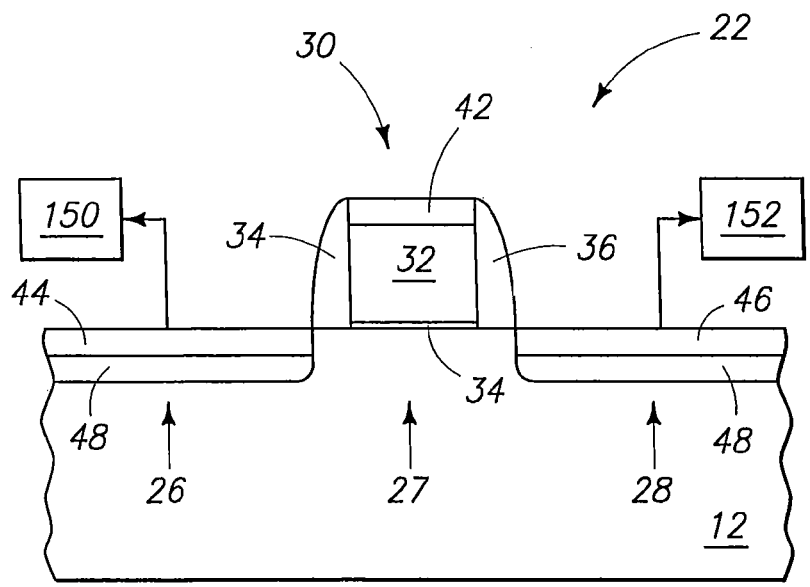
F I G _II_EE

METHODS OF FORMING $CoSi_2$, METHODS OF FORMING FIELD EFFECT TRANSISTORS, AND METHODS OF FORMING CONDUCTIVE CONTACTS

RELATED PATENT DATA

This patent resulted from a continuation application of U.S. patent application Ser. No. 12/244,692, filed Oct. 2, 2008, entitled "Methods of Forming CoSi2, Methods of Forming Field Effect Transistors, and Methods of Forming Conductive Contacts", naming Yongjun Jeff Hu as inventor, which resulted from a continuation application of U.S. patent application Ser. No. 11/195,174, filed Aug. 2, 2005, (now U.S. Pat. No. 7,449,410) entitled "Methods of Forming CoSi2, Methods of Forming Field Effect Transistors, and Methods of Forming Conductive Contacts", naming Yongjun Jeff Hu as inventor, the disclosures of which are incorporated by reference.

TECHNICAL FIELD

This invention relates to methods of forming $CoSi_2$, to methods of forming field effect transistors, and to methods of forming conductive contacts.

BACKGROUND OF THE INVENTION

Metal silicides are conductive metal compounds commonly used in the fabrication of integrated circuitry. Exemplary uses are as conductive interfaces to silicon-containing node locations, and as conductive contacts to and conductive strapping layers for field effect transistor gates.

One exemplary low resistance metal silicide is $CoSi_2$. Cobalt silicide also occurs in the monosilicide form (CoSi), but it is the disilicide form which is of greater conductivity and that which is desired to be used in the fabrication of a conductive integrated circuit component. Cobalt silicide can be expressed as $CoSi_x$, where "x" typically ranges from 0.3 to 2.

One manner of forming cobalt silicide includes deposition of a layer of cobalt over a silicon-containing material, followed by subsequent high temperature anneal causing interdiffusion of the silicon and cobalt, thereby forming cobalt silicide. Typically and preferably, the cobalt layer is deposited directly on (with "on" in the context of this document meaning in at least some direct physical contact therewith) the silicon-containing material to facilitate diffusion of the cobalt and/or silicon to form the silicide. Less preferred, a very thin native oxide might be received intermediate the cobalt and silicon which disperses during the cobalt silicide formation typically still resulting in adequate cobalt silicide formation. Regardless, the typical annealing is conducted by rapid thermal processing (RTP).

The temperature at which the anneal occurs impacts the degree of formation of one or both of CoSi and/or $CoSi_2$. For example, an annealing temperature of from 500° C. to 550° C. forms substantially all CoSi, and a temperature in excess of 800° C. forms substantially all $CoSi_2$. Intervening temperatures tend to form a mixture of CoSi and $CoSi_2$ including other quantities of silicon with respect to cobalt. Further, such different temperatures are largely determinative of which species, cobalt or silicon, is the predominately moving species. For example at the lower temperatures, cobalt diffusion/movement predominates such that the CoSi which forms tends to form mostly in the silicon region of the substrate, for example elevationally lower in the substrate where a cobalt layer is formed elevationally over silicon. On the other hand at the higher temperatures, silicon diffusion/movement predominates such that the $CoSi_2$ which is formed tends to form mostly in the region of the cobalt layer, for example elevationally higher in the substrate where a cobalt layer is deposited over silicon. Further, where higher temperature anneals are conducted to predominately form $CoSi_2$, the silicon migration can tend to form voids within the underlying silicon-containing substrate beneath where the $CoSi_2$ is formed.

In many instances, it would be desirable to form the $CoSi_2$ in the region prior to the annealing which is predominately composed of silicon movement and also in a manner which prevents void formation. One prior art manner of achieving this is to initially anneal at a lower temperature which forms CoSi lower within the substrate where desired, while also typically leaving some of the cobalt layer unreacted. The cobalt is then stripped by a wet etch, and the substrate subsequently subjected to a high temperature anneal which converts the CoSi to $CoSi_2$. This of course requires two separate annealing steps and stripping of unreacted cobalt prior to conducting the second annealing step. Further, it is highly desirable that unreacted cobalt be stripped from the substrate prior to any subsequent exposure of the substrate to temperatures higher than 650° C. This is because cobalt tends to react with underlying oxide at temperatures greater than 650° C. and the resultant cobalt oxide which is formed can be difficult to remove.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention included to methods of forming $CoSi_2$, methods of forming field effect transistors, and methods of forming conductive contacts. In one implementation, a method of forming $CoSi_2$ includes forming a substantially amorphous layer comprising MSi over a silicon-containing substrate, where "M" comprises at least some metal other than cobalt, and preferably a refractory metal. A layer comprising cobalt is deposited over the substantially amorphous $MSi_x$-comprising layer. The substrate is annealed effective to diffuse cobalt of the cobalt-comprising layer through the substantially amorphous $MSi_x$-comprising layer and combine with silicon of the silicon-containing substrate to form $CoSi_2$ beneath the substantially amorphous $MSi_x$-comprising layer.

In one implementation, a method of forming a field effect transistor comprises forming a polysilicon-comprising gate proximate a channel region of a semiconductor substrate. A gate dielectric is received between the gate and the channel region. The channel region is received between a pair of silicon-containing source/drain regions. A substantially amorphous layer comprising $MSi_x$ is deposited over the polysilicon and over the silicon-containing source/drain regions, where "M" comprises at least some metal, and preferably a refractory metal, other than cobalt. A layer comprising cobalt is deposited over the substantially amorphous $MSi_x$-comprising layer. The substrate is annealed effective to diffuse cobalt of the cobalt-comprising layer through the substantially amorphous $MSi_x$-comprising layer and combine with polysilicon of the gate and with silicon of the source/drain regions effective to form a first region comprising $CoSi_2$ beneath the substantially amorphous $MSi_x$-comprising layer on the polysilicon-comprising gate and to form respective second and third regions comprising $CoSi_2$ beneath the substantially amorphous $MSi_x$-comprising layer on the silicon-containing source/drain regions. The first, second, and third regions are spaced from one another.

In one implementation, a method of forming a conductive contact comprises forming insulative material over a silicon-containing node location of a semiconductor substrate. An opening is formed through the insulative material to the silicon-containing node location. A substantially amorphous layer comprising $MSi_x$ is deposited over the insulative material to within the opening and over the silicon-containing node location, where "M" comprises at least some metal, and preferably a refractory metal, other than cobalt. A layer comprising cobalt is deposited over the substantially amorphous $MSi_x$-comprising layer. The substrate is annealed effective to diffuse cobalt of the cobalt-comprising layer through the substantially amorphous $MSi_x$-comprising layer and combine with silicon of the node location effective to form $CoSi_2$ beneath the substantially amorphous $MSi_x$-comprising layer at the node location.

Other aspects and implementations are contemplated.

BRIEF DESCRIPTION OF THE DRAWINGS

Preferred embodiments of the invention are described below with reference to the following accompanying drawings.

FIG. 7 is a view the FIG. 6 substrate fragment at a processing step subsequent to that shown by FIG. 6.

FIG. 8 is a view the FIG. 7 substrate fragment at a processing step subsequent to that shown by FIG. 7.

FIG. 17 is a view of an alternate embodiment substrate processing in accordance with aspects of the invention.

FIG. 18 is a view of an alternate embodiment substrate processing in accordance with aspects of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
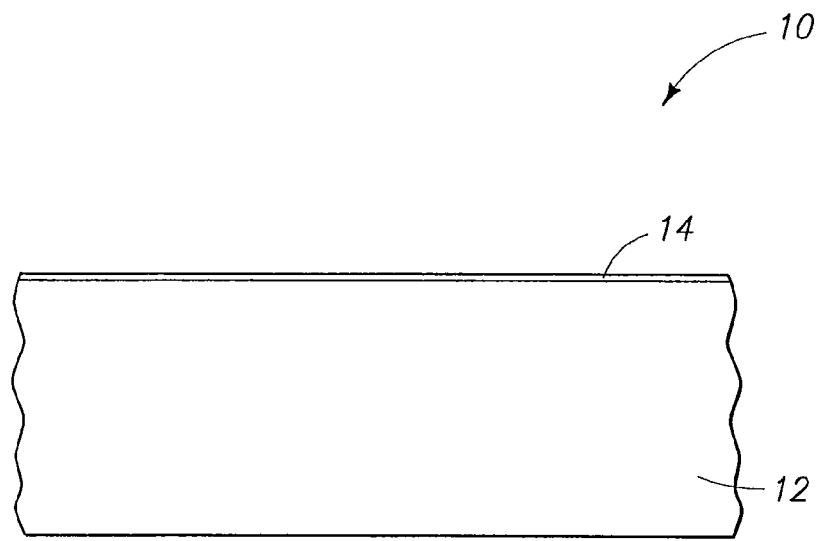
FIG. 1 is a diagrammatic sectional view of a substrate fragment in process in accordance with an aspect of the invention.

A method of forming $CoSi_2$ in accordance with aspects of the invention is initially described with reference to FIGS. 1-4. FIG. 1 depicts a substrate indicated generally with reference numeral 10. Substrate 10 typically and preferably comprises a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). Substrate 10 is depicted as comprising a silicon-containing substrate 12, for example bulk monocrystalline silicon. Of course, silicon-on-insulator substrates are also contemplated as well as any other substrate which is at least somewhere silicon-containing. A substantially amorphous layer 14 comprising $MSi_x$ has been formed over silicon-containing substrate 12, where "M" comprises at least some metal other than cobalt. "M" might comprise a mixture of metals other than cobalt, or might comprise a single metal other than cobalt, for example Ta or other metal, with "M" most preferably comprising a refractory metal. Further, substantially amorphous $MSi_x$-comprising layer 14 might comprise/include some cobalt, or alternately and preferably might be void of detectable cobalt in the substrate of FIG. 1. Regardless, in one preferred implementation "x" of $MSi_x$ ranges from 0.1 to 4.

In the context of this document, "substantially amorphous" does not preclude some degree of crystallinity, yet requires that the layer which is "substantially amorphous" be at least 65 percent by volume of an amorphous phase. Preferably, substantially amorphous $MSi_x$-comprising layer 14 is at least 70 volume percent amorphous, more preferably at least 90 volume percent amorphous, and even more preferably at least 95 percent amorphous. Further preferably, substantially amorphous $MSi_x$-comprising layer 14 is void of any crystalline grain boundaries extending completely through the thickness of layer 14. One reason for preclusion of any such crystalline grain boundaries is to restrict silicon diffusion as described below. FIG. 1 further depicts a preferred embodiment wherein substantially amorphous $MSi_x$-comprising layer 14 is formed on silicon of silicon-containing substrate 12. An exemplary preferred thickness range for layer 14 is from 5 Angstroms to 1,000 Angstroms, more preferably from 15 Angstroms to 100 Angstroms, and even more preferably from 20 Angstroms to 40 Angstroms.

Figure 2:
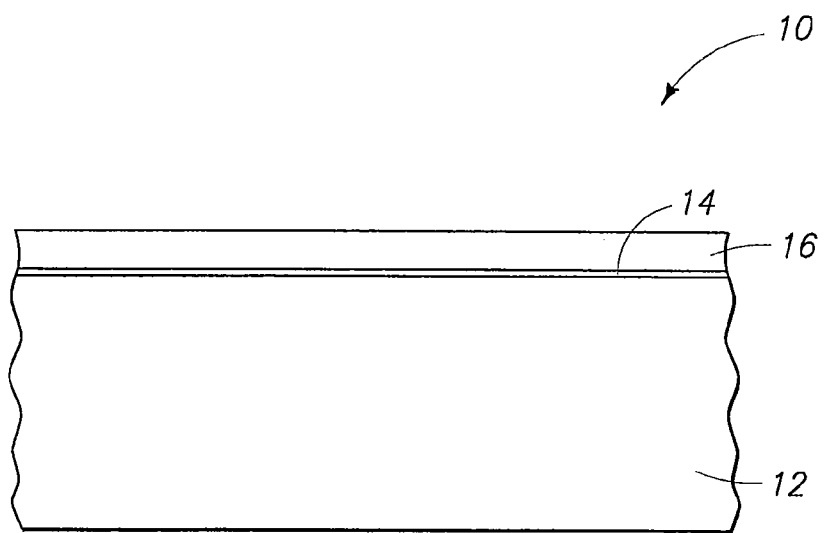
FIG. 2 is a view the FIG. 1 substrate fragment at a processing step subsequent to that shown by FIG. 1.

Referring to FIG. 2, a layer 16 comprising cobalt has been deposited over, and preferably on as shown, substantially amorphous $MSi_x$-comprising layer 14. An exemplary preferred thickness range for cobalt-comprising layer 16 is from 20 Angstroms to 1,000 Angstroms. Cobalt-comprising layer 16 preferably comprises elemental-form cobalt. However, alloy, metal compound, and other cobalt-including materials are contemplated. Preferably if other than elemental-form cobalt, layer 16 is predominately comprised of cobalt or excess of a stoichiometric amount of cobalt in a cobalt compound. To prevent top surface oxidation of material 16 (if desired), a thin Ti and/or TiN layer (i.e., 30 Angstroms to 100 Angstroms) can be deposited atop material 16 (not shown).

Figure 3:
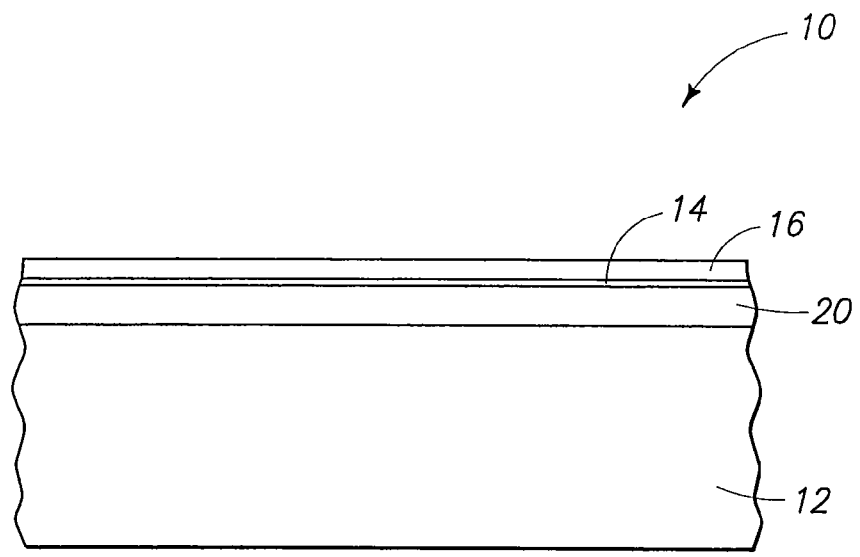
FIG. 3 is a view the FIG. 2 substrate fragment at a processing step subsequent to that shown by FIG. 2.

Referring to FIG. 3, substrate fragment 10 has been annealed effective to diffuse cobalt of cobalt-comprising layer 16 through substantially amorphous $MSi_x$-comprising layer 14 and combine such cobalt with silicon of silicon-containing substrate 12 to form $CoSi_2$ 20 beneath substantially amorphous $MSi_x$-comprising layer 14. Such might also form some $CoSi_2$ above or within layer 14, but at least some will also form beneath layer 14. Most preferably, such annealing is conducted at a temperature of no greater than 650° C. and at a temperature of no less than 450° C. One exemplary specific preferred annealing temperature range is from 500° C. to 600° C. Any suitable annealing is contemplated, with RTP being but one specific example, for example having a temperature ramp rate of at least 10° C. per second up to one or more desired annealing temperatures. A specific preferred example includes a rapid thermal processing temperature ramp at from 25° C. per second to 75° C. per second to 550° C., and maintaining temperature at 550° C. for from 20 seconds to 30 seconds. The atmosphere during such annealing is preferably inert, for example consisting essentially of $N_2$ and/or one or more noble gases. Pressure can be atmospheric, subatmospheric, or greater than atmospheric pressure. A reduction to practice pressure was 10 Torr.

In one preferred example, the annealing forms no more than 5 atomic percent CoSi, if any, of a total of all cobalt silicide formed by the annealing, and preferably no more than 1 atomic percent CoSi, if any. Further in one preferred embodiment, the $CoSi_2$ is in crystalline form and the silicon of the silicon-containing substrate from which such is formed is also in crystalline form. Typically and preferably in such instance, the $CoSi_2$ formed will be of the same crystalline structure as the silicon of the silicon-containing substrate.

Figure 4:
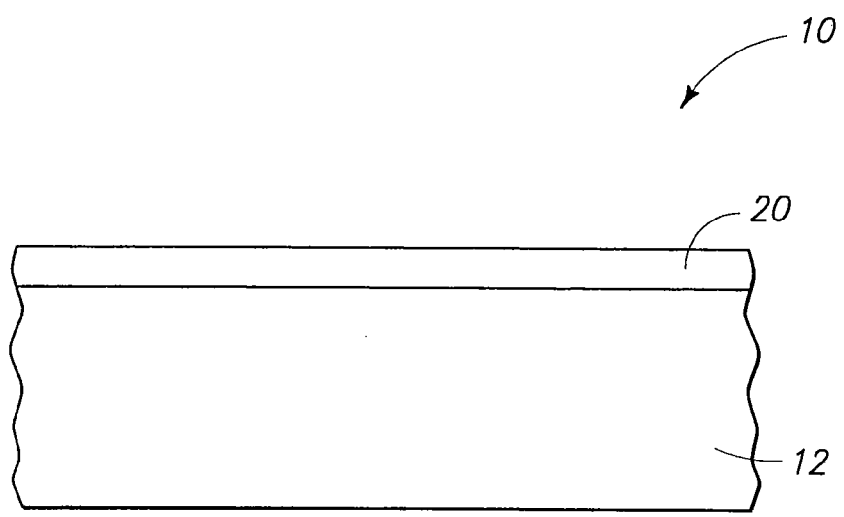
FIG. 4 is a view the FIG. 3 substrate fragment at a processing step subsequent to that shown by FIG. 3.

FIGS. 2 and 3 depict excess cobalt material 16 being fabricated such that all of layer 16 is not consumed in forming $CoSi_2$ 20 of FIG. 3. The invention also, of course, contemplates deposition of a cobalt-comprising material 16 to a suitably thin thickness and/or conducting the annealing under conditions such that all of cobalt-comprising layer 16 is consumed and converted to cobalt silicide. Regardless, any remaining of cobalt-comprising material 16 and $MSi_x$-comprising layer 14 might be desired to remain as part of the integrated circuitry being fabricated, or alternately be removed. Accordingly in one aspect, the invention contemplates removing all remaining of any of cobalt-comprising layer 16 and/or all remaining of any of $MSi_x$-comprising layer 14 from the substrate after the annealing. For example, FIG. 4 depicts all remaining of layers 16 and 14 (not shown) having been removed from the substrate. For example, elemental cobalt can be stripped utilizing a wet mixture of HCl, $H_2O_2$ and $H_2O$, while $TaSi_x$ can be removed utilizing a mixture of $H_2SO_4$, $H_2O_2$, and $H_2O$, or with a dry chlorine based etch chemistry.

Aspects of the invention as described above in a method of forming $CoSi_2$ might be utilized in fabrication of any such layer or materials to be formed as part of integrated circuitry, or even as a sacrificial material not necessarily constituting part of integrated circuitry being fabricated. Regardless, an exemplary method of forming a field effect transistor comprising $CoSi_2$ fabricated in accordance with an aspect of the invention is next described with reference to FIGS. 5-10.

Figure 5:
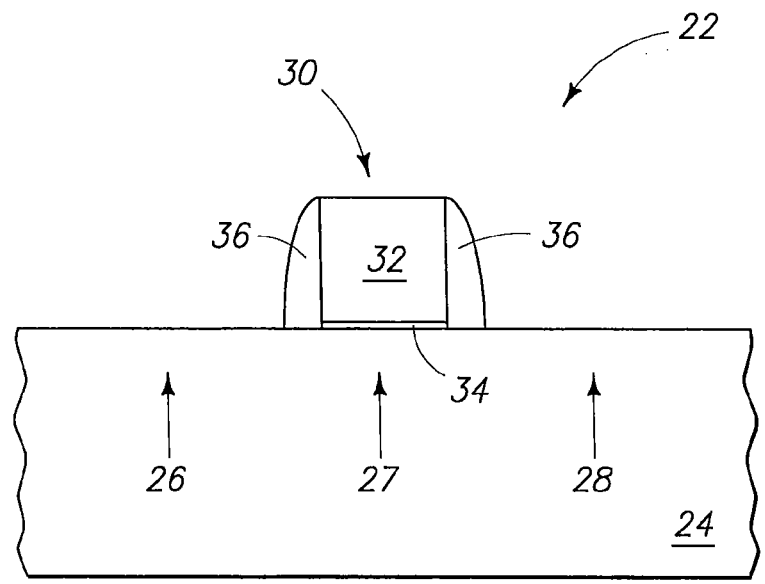
FIG. 5 is a diagrammatic sectional view of a substrate fragment in process in accordance with an aspect of the invention.

FIG. 5 depicts a substrate fragment 22 comprising a semiconductor substrate 24. Substrate 24 preferably has any of the above-described attributes of substrate 12 of the first-described embodiment, with monocrystalline silicon being but one preferred example. Substrate 24 is depicted as comprising a pair of silicon-containing source/drain regions 26 and 28 having a channel region 27 received there between. Such regions may or may not be suitably doped at this point in the process but nevertheless constitute regions within which a channel region (27) and source/drain regions (26, 28) will ultimately at least be partially received. A gate construction 30 is provided relative to semiconductor substrate 24. Such comprises a conductive polysilicon-comprising gate 32 received operably proximate channel region 27, and has a gate dielectric 34 received between gate 32 and channel region 27. The depicted exemplary embodiment is with respect to a conventional horizontal, planar oriented field effect transistor. However of course, the invention contemplates fabrication relative to any field effect transistor orientation, and whether existing or yet-to-be developed. For example and by way of example only, constructions are contemplated where the gate is received beneath or laterally of the channel region, including vertical and other oriented transistors. Gate construction 30 in the depicted preferred embodiment is also shown as comprising anisotropically etched insulative sidewall spacers 36 which have been formed over sidewalls of polysilicon-comprising gate 32. Exemplary preferred materials include one or a combination of silicon dioxide and silicon nitride.

Figure 6:
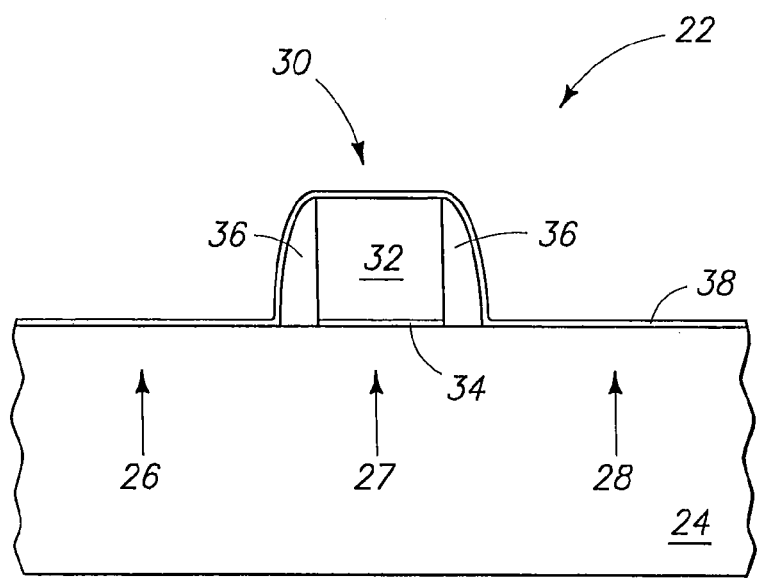
FIG. 6 is a view the FIG. 5 substrate fragment at a processing step subsequent to that shown by FIG. 5.

Referring to FIG. 6, a substantially amorphous layer 38 comprising $MSi_x$ has been deposited over polysilicon 32 and over silicon-containing source/drain regions 26 and 28 (and preferably on polysilicon 32 and on source/drain regions 26 and 28), where "M" comprises at least some metal other than cobalt. Attributes of layer 38 are otherwise preferably as described above with respect to substantially amorphous $MSi_x$-comprising layer 14 of the first-described embodiment.

Referring to FIG. 7, a layer 40 comprising cobalt is deposited over (and preferably on) substantially amorphous $MSi_x$-comprising layer 38. Preferred attributes of layer 40 are otherwise preferably as described above in connection with cobalt-comprising layer 16 of the first-described embodiment.

Referring to FIG. 8, substrate 22 has been annealed effective to diffuse cobalt of cobalt-comprising layer 40 through substantially amorphous $MSi_x$-comprising layer 38 and combine such cobalt with polysilicon of gate 32 effective to form a first region 42 comprising $CoSi_2$ beneath substantially amorphous $MSi_x$-comprising layer 38 on polysilicon-comprising gate 32. Such annealing has also been effective to diffuse cobalt of cobalt-comprising layer 40 through substantially amorphous $MSi_x$-comprising layer 38 and combine such cobalt with silicon of source/drain regions 26 and 28 to form respective second and third regions 44 and 46 comprising $CoSi_2$ beneath substantially amorphous $MSi_x$-comprising layer 38 on silicon-containing source/drain regions 26 and 28, and wherein first region 42, second region 44, and third region 46 are spaced from one another. Preferred attributes of the annealing are preferably as described above in the fabrication of $CoSi_2$ region 20 in the first-described embodiment.

Figure 9:
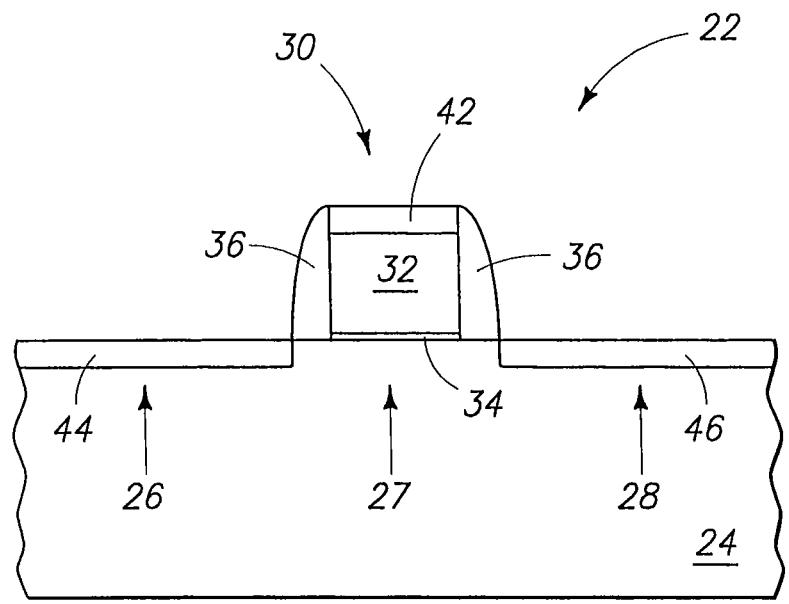
FIG. 9 is a view the FIG. 8 substrate fragment at a processing step subsequent to that shown by FIG. 8.

As in the first-described embodiment, some or all of any remaining cobalt and $MSi_x$ material might remain or be removed from the substrate. FIG. 9, by way of example only, depicts complete removal of any remaining of cobalt-comprising material 40 (not shown) and MSi$_x$-comprising material 38 (not shown) from the substrate. Alternately and by way of example only, processing might be conducted whereby not all remaining of the MSi$_x$-comprising material is removed, and perhaps at least or only that portion of MSi$_x$-comprising layer which is received between spaced first region 42, second region 44 and third region 46 from substrate 22 after the annealing.

Figure 10:
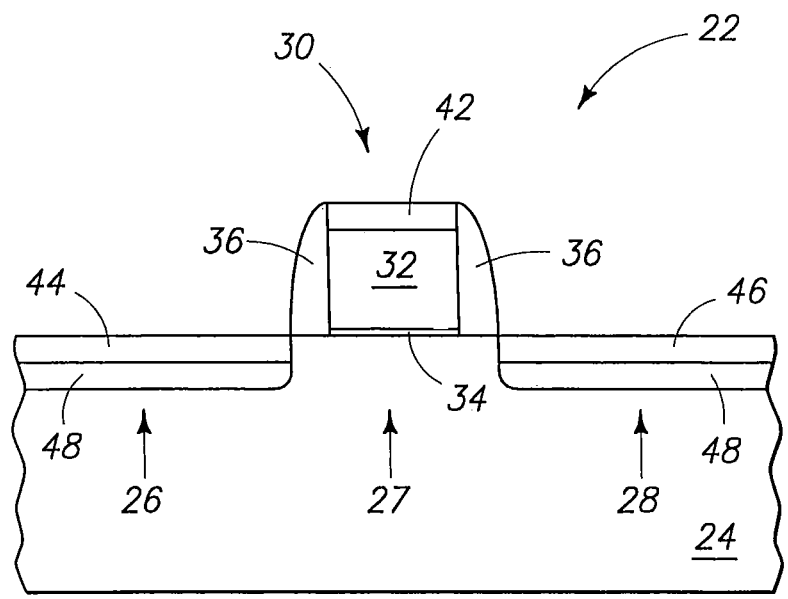
FIG. 10 is a view the FIG. 9 substrate fragment at a processing step subsequent to that shown by FIG. 9.

As referred to above, the invention contemplates ultimate fabrication of operable source/drain regions before or after any of the above-described processing. Accordingly in one implementation, and by way of example only, the invention contemplates implanting a highest concentration doped portion of the source/drain regions prior to the annealing, and in another exemplary implementation after the annealing. For example, FIG. 10 depicts formation of highest concentration doped portions 48 of the respective source/drain regions occurring by implanting of the FIG. 9 substrate. The implant species could, of course, be of "p" and/or "n" type as known by people of skill in the art. Further, LDD, halo, etc. implants might also be additionally be provided at any point in the fabrication of a field effect transistor.

Figure 11:
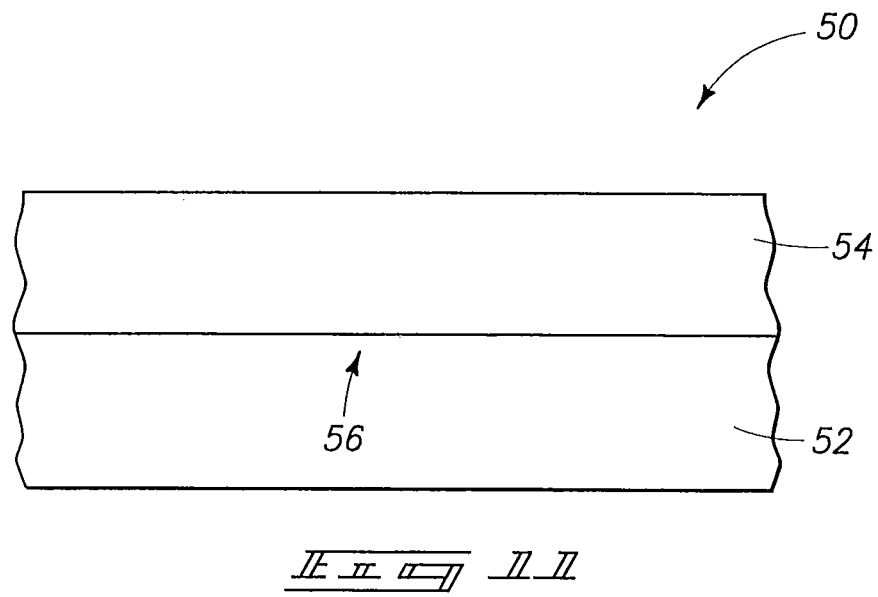
FIG. 11 is a diagrammatic sectional view of a substrate fragment in process in accordance with an aspect of the invention.

By way of example only, aspects of the invention also encompass or contemplate methods of forming conductive contacts, for example as described below in connection with embodiments as shown in FIGS. 11-17. FIG. 11 depicts a substrate fragment 50 comprising a silicon-containing substrate 52 having some insulative material 54 formed thereover. Exemplary preferred attributes for substrate 52 are those as described above in connection with substrate/material 12 of the first-described embodiment. Insulative material 54 might comprise one or more different insulative materials, with one or a combination of silicon dioxide (whether doped or undoped) and silicon nitride being but two examples. An exemplary preferred thickness for material 54 is from 400 Angstroms to 30,000 Angstroms. FIG. 11 can be considered as constituting some silicon-containing node location 56 over (preferably on as shown) which material 54 has been formed.

Figure 12:
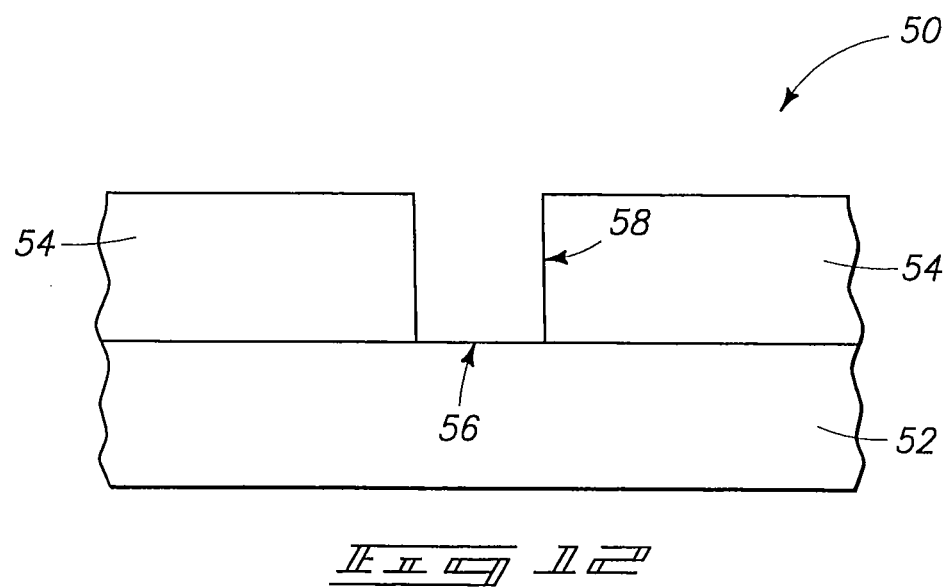
FIG. 12 is a view the FIG. 11 substrate fragment at a processing step subsequent to that shown by FIG. 11.

Referring to FIG. 12, an opening 58 has been formed through insulative material 54 to silicon-containing node location 56. By way of example only, an exemplary process comprises photolithographic patterning and etch. By way of example only, an exemplary minimum width for opening 58 is from 50 Angstroms to 900×10$^4$ Angstroms.

Figure 13:
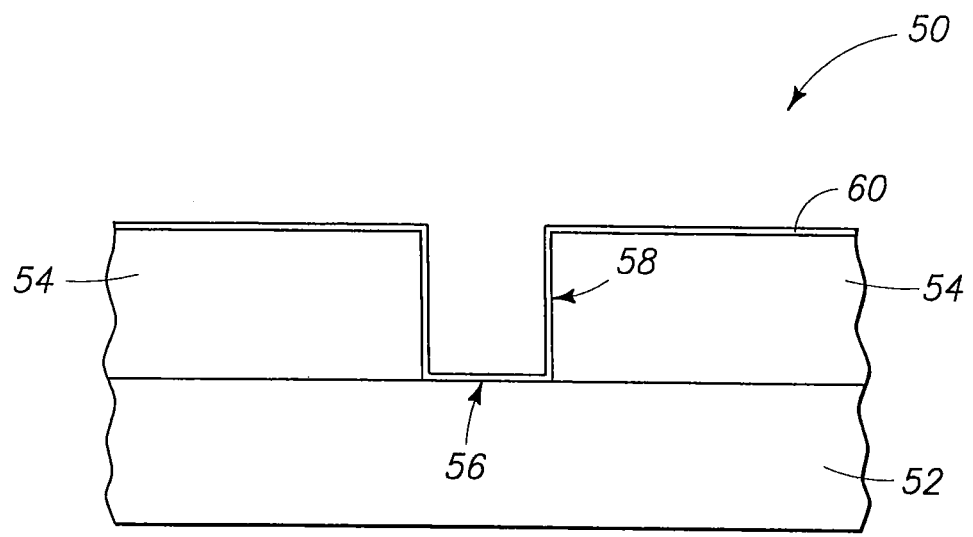
FIG. 13 is a view the FIG. 12 substrate fragment at a processing step subsequent to that shown by FIG. 12.

Referring to FIG. 13, a substantially amorphous layer 60 comprising MSi$_x$ has been deposited over insulative material 54 to within opening 58 and over (preferably on) silicon-containing node location 56, where "M" comprises at least some metal other than cobalt. Preferred attributes for substantially amorphous MSi$_x$-comprising layer 60 are otherwise as described above in connection with substantially amorphous MSi$_x$-comprising layer 14 of the first-described embodiment.

Figure 14:
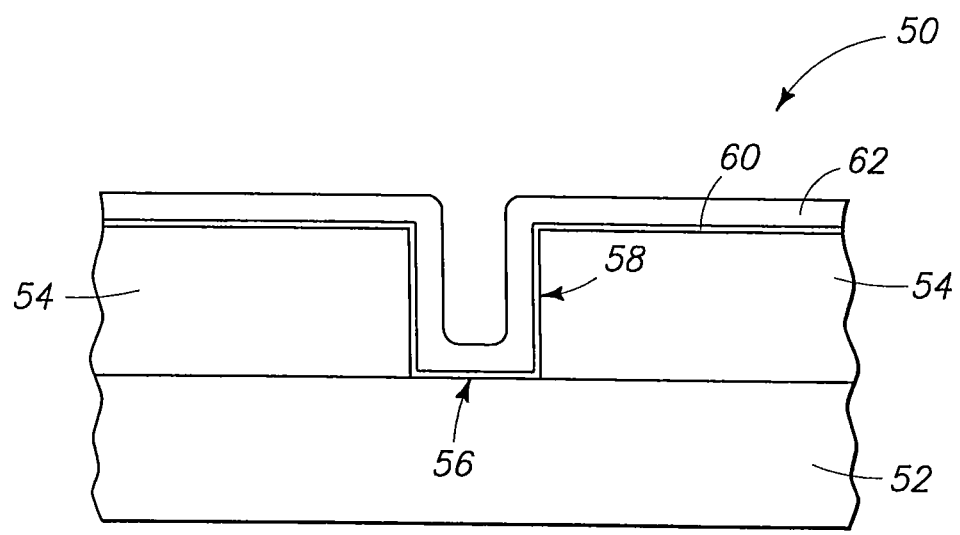
FIG. 14 is a view the FIG. 13 substrate fragment at a processing step subsequent to that shown by FIG. 13.

Referring to FIG. 14, a layer 62 comprising cobalt has been deposited over (preferably on) substantially amorphous MSi$_x$-comprising layer 60 within opening 58 as shown. Cobalt-comprising layer 62 might partially or completely fill remaining portions of opening 58, with less than complete filling being depicted in FIG. 14. Preferred attributes for cobalt-comprising layer 62 are preferably otherwise as described above with respect to cobalt-comprising layer 16 in the first-described embodiment.

Figure 15:
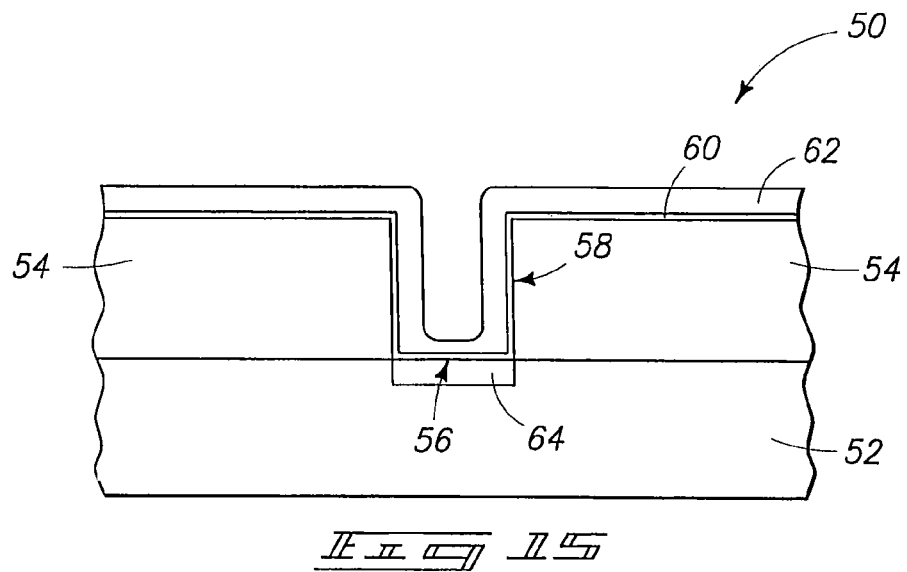
FIG. 15 is a view the FIG. 14 substrate fragment at a processing step subsequent to that shown by FIG. 14.

Referring to FIG. 15, substrate 50 has been annealed effective to diffuse cobalt of cobalt-comprising layer 62 through substantially amorphous MSi$_x$-comprising layer 60 and combine such cobalt with silicon of node location 56 effective to form CoSi$_2$ 64 beneath substantially amorphous MSi$_x$-comprising layer 60 at node location 56. Processing with respect to the annealing is preferably as described above in connection with fabrication of CoSi$_2$-comprising region 20 in the first-described embodiment.

Figure 16:
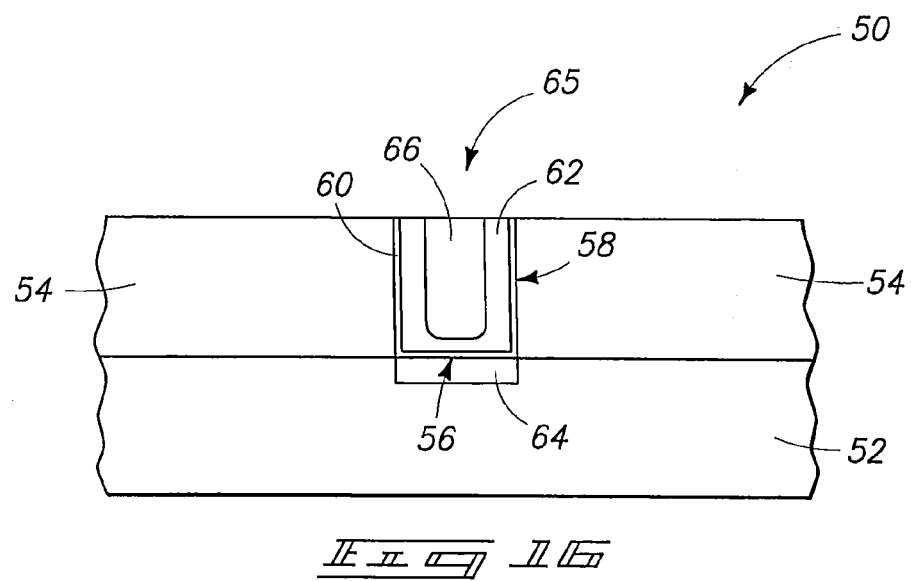
FIG. 16 is a view the FIG. 15 substrate fragment at a processing step subsequent to that shown by FIG. 15.

FIG. 16 depicts exemplary subsequent processing whereby a conductive contact 65 within opening 58 has been fabricated to node location 56. An exemplary manner of forming the same is by deposition of another conductive material 66 (i.e., any of one or more elemental metals, one or more alloys, one or more conductive compounds, and/or one or more conductively doped semiconductive materials) followed by a subsequent polishing (i.e., chemical mechanical polishing) or other removal of materials 60, 62 and 66 which were received elevationally outward of insulative material 54. Alternately of course, and by way of examples only, damascene-like processing is contemplated, or an exemplary subtractive patterning and etch of materials 60, 62 and 66 such that a conductive line is fabricated as part of the conductive contact elevationally outward of insulative material 54.

The invention also, of course, contemplates removal of some or all of materials 60 and 62 after the annealing, for example as depicted in FIG. 17 in connection with a substrate fragment 50a. Like numerals from the FIGS. 11-16 embodiment have been utilized where appropriate, with differences being indicated with the suffix "a". FIG. 17 depicts materials 60 and 62 (not shown) as having been removed, and conductive material(s) 66a formed within contact opening 58. An exemplary conductive material 66a includes a tungsten plug lined with TiN.

In fabricating an integrated circuit, such might comprise any circuit, or sub-circuit. Further by way of example only, such might comprise memory circuitry, for example DRAM circuitry. For example, FIG. 18 depicts the field effect transistor of FIG. 10 incorporated into a DRAM memory cell. Specifically, CoSi$_2$ region 44 is electrically connected to a storage device 150, and CoSi$_2$ region 46 is electrically connected to a bitline 152. Storage device 150 can comprise any suitable device, including a capacitor, for example. Bitline 152 can comprise any suitable construction. The field effect transistor can be considered to be part of an integrated circuit, for example the DRAM integrated circuitry just described.

Figure 19:
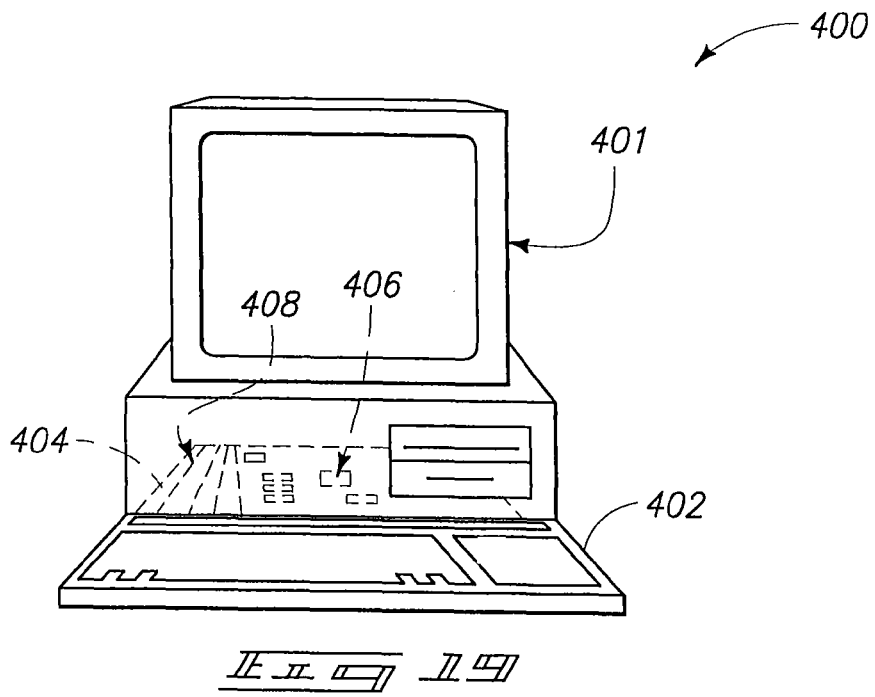
FIG. 19 is a diagrammatic view of a computer illustrating an exemplary application of the present invention.
Figure 20:
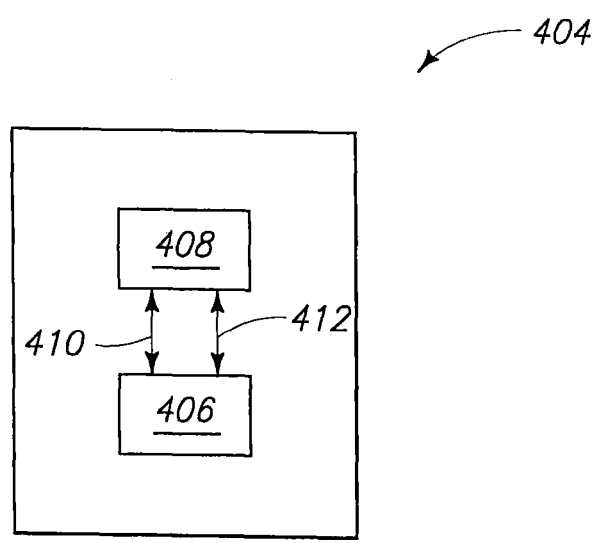
FIG. 20 is a block diagram showing particular features of the motherboard of the FIG. 15 computer.

FIG. 19 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines, bitlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 20. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices, by way of example only, include SDRAM, DDR SDRAM, SLDRAM, VRAM and Direct RDRAM, as well as others such as SRAM or Flash memories.

Figure 21:
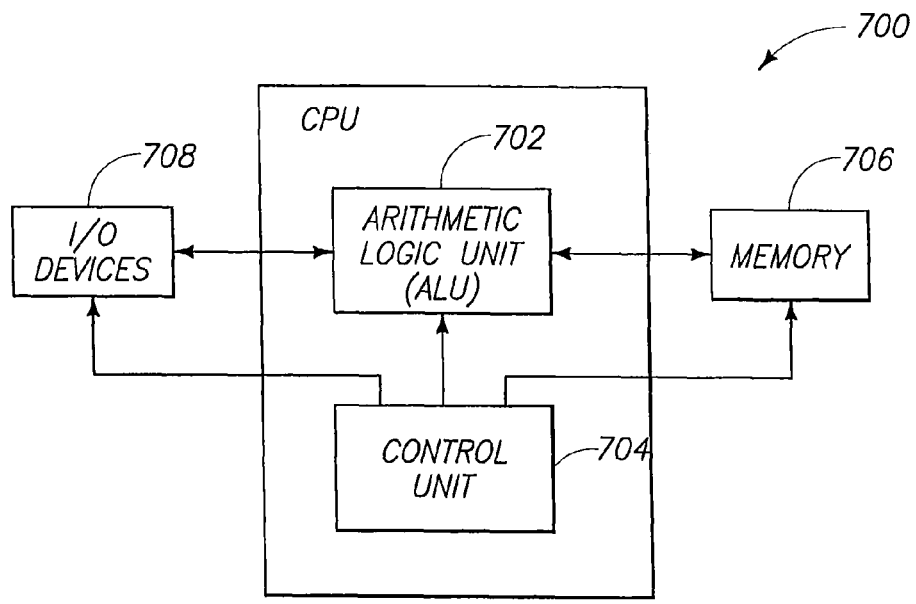
FIG. 21 is a high-level block diagram of an electronic system according to an exemplary aspect of the present invention.

FIG. 21 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by processor 702 and other interactions between processor 702, memory device unit 706 and I/O devices 708. Control unit 704 coordinates all operations of processor 702, memory device 706 and I/O devices 708 by continuously cycling through a set of operations that cause instructions to be fetched from memory device 706 and executed. In various embodiments, memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells, wordlines and bitlines in accordance with various aspects of the present invention.

Figure 22:
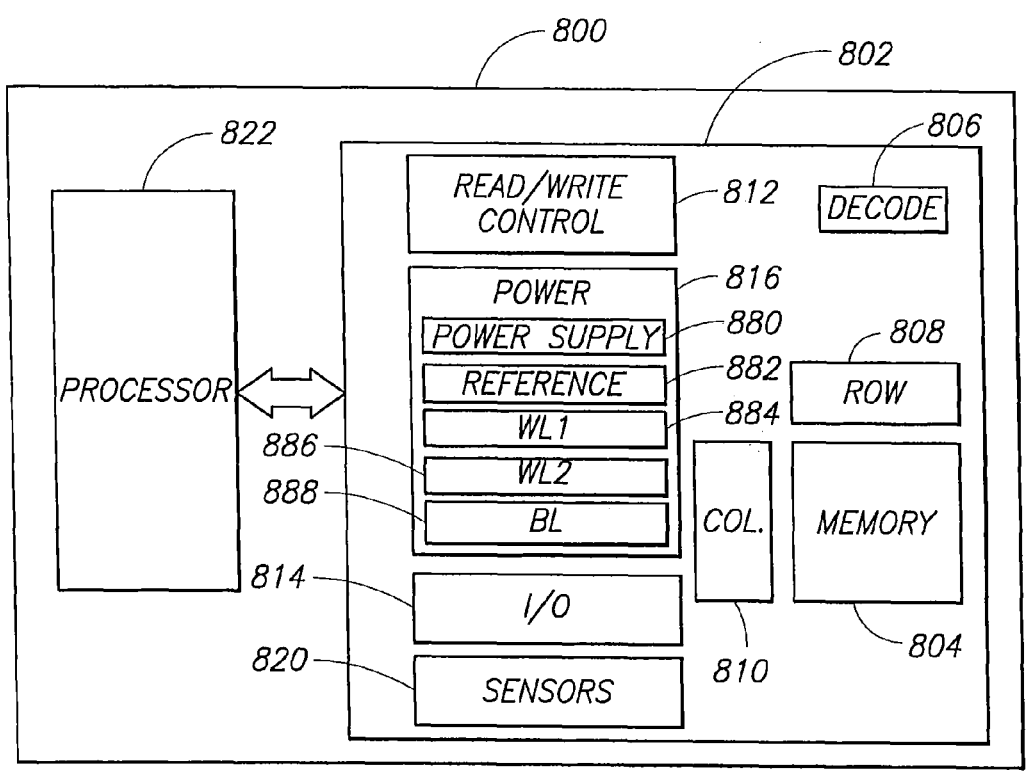
FIG. 22 is a simplified block diagram of an exemplary electronic system according to an aspect of the present invention.

FIG. 22 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. Memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. System 800 also includes a processor 822, or memory controller for memory accessing.

Memory device 802 receives control signals 824 from processor 822 over wiring or metallization lines. Memory device 802 is used to store data which is accessed via I/O lines. It will be appreciated by those skilled in the art that additional circuitry and control signals can be provided, and that memory device 802 has been simplified to help focus on the invention.

At least one of processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells, wordlines and bitlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming $CoSi_2$, comprising:
    forming a substantially amorphous layer comprising $MSi_x$ over a silicon-containing substrate, where "M" comprises at least some metal other than cobalt;
    depositing a layer comprising cobalt over the substantially amorphous $MSi_x$-comprising layer; and
    annealing the substrate effective to diffuse cobalt of the cobalt-comprising layer through the substantially amorphous $MSi_x$-comprising layer and combine with silicon of the silicon-containing substrate to form $CoSi_2$ beneath and above the substantially amorphous $MSi_x$-comprising layer.

2. The method of claim 1 wherein the annealing forms $CoSi_2$ within the substantially amorphous $MSi_x$-comprising layer.

3. A method of forming a field effect transistor, comprising:
    forming a pair of spaced silicon-containing source/drain regions of a semiconductor substrate;
    depositing a substantially amorphous layer comprising $MSi_x$ over the silicon-containing source/drain regions, where "M" comprises one of:
    a mixture of different metals;
    a mixture of refractory metals other than cobalt prior to the depositing;
    cobalt and at least one metal other than cobalt prior to the depositing; and
    tantalum;
    depositing a layer comprising cobalt over the substantially amorphous $MSi_x$-comprising layer;
    annealing the substrate effective to diffuse cobalt of the cobalt-comprising layer through the substantially amorphous $MSi_x$-comprising layer and combine with silicon of the source/drain regions effective to form regions comprising $CoSi_2$ beneath the substantially amorphous $MSl_x$-comprising layer on the silicon-containing source/drain regions; and providing a gate proximate a channel region of the semiconductor substrate, and providing a gate dielectric between the gate and the channel region, the channel region being between the a pair of source/drain regions.

4. The method of claim 3 wherein "M" comprises a mixture of different metals.

5. The method of claim 3 wherein "M" comprises a mixture of refractory metals other than cobalt prior to the depositing.

6. The method of claim 3 wherein "M" comprises cobalt prior to the depositing.

7. The method of claim 3 wherein "M" comprises tantalum.

8. The method of claim 3 wherein $CoSi_2$ is formed within the substantially amorphous $MSi_x$-comprising layer.

9. The method of claim 3 wherein $CoSi_2$ is formed above and within the substantially amorphous $MSi_x$-comprising layer.

10. A method of forming a field effect transistor, comprising:

forming a pair of spaced silicon-containing source/drain regions of a semiconductor substrate;

depositing a substantially amorphous layer comprising $MSi_X$ over the silicon-containing source/drain regions, where "M" comprises some metal other than cobalt;

depositing a layer comprising cobalt over the substantially amorphous $MSi_x$-comprising layer;

providing an oxidation barrier comprising elemental Ti over the cobalt-comprising layer;

annealing the substrate effective to diffuse cobalt of the cobalt-comprising layer through the substantially amorphous $MSi_x$-comprising layer and combine with silicon of the source/drain regions effective to form regions comprising $CoSi_2$ beneath the substantially amorphous $MSi_x$-comprising layer on the silicon-containing source/drain regions; and providing a gate proximate a channel region of the semiconductor substrate, and providing a gate dielectric between the gate and the channel region, the channel region being between the a pair of source/drain regions.

11. The method of claim 10 wherein $CoSi_2$ is formed within the substantially amorphous $MSi_x$-comprising layer.

12. The method of claim 10 wherein $CoSi_2$ is formed above and within the substantially amorphous $MSi_x$-comprising layer.

13. A method of forming a field effect transistor, comprising:

forming a pair of spaced silicon-containing source/drain regions of a semiconductor substrate;

depositing a substantially amorphous layer comprising $MSi_x$ over the silicon-containing source/drain regions, where "M" comprises some metal other than cobalt;

depositing a layer comprising cobalt over the substantially amorphous $MSi_x$-comprising layer;

annealing the substrate effective to diffuse cobalt of the cobalt-comprising layer through the substantially amorphous $MSi_x$-comprising layer and combine with silicon of the source/drain regions effective to form regions comprising $CoSi_2$ beneath the substantially amorphous $MSi_x$-comprising layer on the silicon-containing source/drain regions, the cobalt-comprising layer comprising one of an alloy or cobalt-containing compound prior to the annealing; and providing a gate proximate a channel region of the semiconductor substrate, and providing a gate dielectric between the gate and the channel region, the channel region being between the a pair of source/drain regions.

14. The method of claim 13 wherein the cobalt-comprising layer comprises an alloy prior to the annealing.

15. The method of claim 13 wherein the cobalt-comprising layer comprises a cobalt-containing compound prior to the annealing.

16. The method of claim 13 wherein $CoSi_2$ is formed within the substantially amorphous $MSi_x$-comprising layer.

17. The method of claim 13 wherein $CoSi_2$ is formed above and within the substantially amorphous $MSi_x$-comprising layer.

18. A method of forming a field effect transistor, comprising:

forming a silicon-comprising gate proximate a channel region of a semiconductor substrate, a gate dielectric being received between the gate and the channel region, the channel region being received between a pair of source/drain regions;

depositing a substantially amorphous layer comprising $MSi_X$ over the silicon-comprising gate, where "M" comprises one of:
 a mixture of different metals;
 a mixture of refractory metals other than cobalt prior to the depositing;
 cobalt and at least one metal other than cobalt prior to the depositing; and
 tantalum;

depositing a layer comprising cobalt over the substantially amorphous $MSi_x$-comprising layer; and annealing the substrate effective to diffuse cobalt of the cobalt-comprising layer through the substantially amorphous $MSi_x$-comprising layer and combine with silicon of the gate to form a region comprising $CoSi_2$ beneath the substantially amorphous $MSi_x$-comprising layer on the silicon-comprising gate.

19. The method of claim 18 wherein "M" comprises a mixture of different metals.

20. The method of claim 18 wherein "M" comprises a mixture of refractory metals other than cobalt prior to the depositing.

21. The method of claim 18 wherein "M" comprises cobalt prior to the depositing.

22. The method of claim 18 wherein "M" comprises tantalum.

23. The method of claim 18 wherein $CoSi_2$ is formed within the substantially amorphous $MSi_x$-comprising layer.

24. The method of claim 18 wherein $CoSi_2$ is formed above and within the substantially amorphous $MSi_x$-comprising layer.

25. A method of forming a field effect transistor, comprising:

forming a silicon-comprising gate proximate a channel region of a semiconductor substrate, a gate dielectric being received between the gate and the channel region, the channel region being received between a pair of source/drain regions;

depositing a substantially amorphous layer comprising $MSi_x$ over the silicon-comprising gate, where "M" comprises some metal other than cobalt;

depositing a layer comprising cobalt over the substantially amorphous $MSi_x$-comprising layer;

providing an oxidation barrier comprising elemental Ti over the cobalt-comprising layer; and annealing the substrate effective to diffuse cobalt of the cobalt-comprising layer through the substantially amorphous $MSi_x$-comprising layer and combine with silicon of the gate to form a region comprising $CoSi_2$ beneath the substantially amorphous $MSi_x$-comprising layer on the silicon-comprising gate.

26. The method of claim 25 wherein $CoSi_2$ is formed within the substantially amorphous $MSi_x$-comprising layer.

27. The method of claim 25 wherein $CoSi_2$ is formed above and within the substantially amorphous $MSi_x$-comprising layer.

28. A method of forming a field effect transistor, comprising:
   forming a silicon-comprising gate proximate a channel region of a semiconductor substrate, a gate dielectric being received between the gate and the channel region, the channel region being received between a pair of source/drain regions;
   depositing a substantially amorphous layer comprising $MSi_X$ over the silicon-comprising gate, where "M" comprises some metal other than cobalt;
   depositing a layer comprising cobalt over the substantially amorphous $MSi_x$-comprising layer; and
   annealing the substrate effective to diffuse cobalt of the cobalt-comprising layer through the substantially amorphous $MSi_x$-comprising layer and combine with silicon of the gate to form a region comprising $CoSi_2$ beneath the substantially amorphous $MSi_x$-comprising layer on the silicon-comprising gate, the cobalt-comprising layer comprising one of an alloy or cobalt-containing compound prior to the annealing.

29. The method of claim 28 wherein the cobalt-comprising layer comprises an alloy prior to the annealing.

30. The method of claim 28 wherein the cobalt-comprising layer comprises a cobalt-containing compound prior to the annealing.

31. The method of claim 28 wherein $CoSi_2$ is formed within the substantially amorphous $MSi_x$-comprising layer.

32. The method of claim 28 wherein $CoSi_2$ is formed above and within the substantially amorphous $MSi_x$-comprising layer.

* * * * *

UNITED STATES PATENT AND TRADEMARK OFFICE
CERTIFICATE OF CORRECTION

| | |
|---|---|
| PATENT NO. | : 8,435,889 B2 |
| APPLICATION NO. | : 13/182285 |
| DATED | : May 7, 2013 |
| INVENTOR(S) | : Yongjun Jeff Hu |

Page 1 of 1

It is certified that error appears in the above-identified patent and that said Letters Patent is hereby corrected as shown below:

In the Claims

In column 10, line 54, In Claim 3, delete "MSiX" and insert -- MSix --, therefor.

In column 11, line 2, In Claim 3, delete "MS1x" and insert -- MSix --, therefor.

In column 11, line 7, In Claim 3, delete "the a" and insert -- the --, therefor.

In column 11, line 26, In Claim 10, delete "MSiX" and insert -- MSix --, therefor.

In column 11, line 42, In Claim 10, delete "the a" and insert -- the --, therefor.

In column 12, line 2, In Claim 13, delete "the a" and insert -- the --, therefor.

In column 12, line 21, In Claim 18, delete "MSiX" and insert -- MSix --, therefor.

In column 13, line 17, In Claim 28, delete "MSiX" and insert -- MSix --, therefor.

Signed and Sealed this
Sixteenth Day of July, 2013

Teresa Stanek Rea
*Acting Director of the United States Patent and Trademark Office*